United States Patent
Zhang et al.

(10) Patent No.: US 10,752,120 B2
(45) Date of Patent: Aug. 25, 2020

(54) CHARGING DEVICE OF AUTOMATIC CRUISE PLATFORM FOR GREENHOUSE

(71) Applicant: Jiangsu University, Jiangsu (CN)

(72) Inventors: Xiaodong Zhang, Jiangsu (CN); Hanping Mao, Jiangsu (CN); Hongyan Gao, Jiangsu (CN); Zhiyu Zuo, Jiangsu (CN); Baijing Qiu, Jiangsu (CN); Hongtao Zhang, Jiangsu (CN); Yixue Zhang, Jiangsu (CN)

(73) Assignee: JIANGSU UNIVERSITY, Jiangsu (CN)

( * ) Notice: Subject to any disclaimer, the term of this patent is extended or adjusted under 35 U.S.C. 154(b) by 377 days.

(21) Appl. No.: 15/742,790

(22) PCT Filed: Dec. 18, 2015

(86) PCT No.: PCT/CN2015/097792
§ 371 (c)(1),
(2) Date: Jan. 8, 2018

(87) PCT Pub. No.: WO2017/004944
PCT Pub. Date: Jan. 12, 2017

(65) Prior Publication Data
US 2018/0201146 A1 Jul. 19, 2018

(30) Foreign Application Priority Data

Jul. 8, 2015 (CN) .......................... 2015 1 0398874

(51) Int. Cl.
*B60L 11/18* (2006.01)
*B60L 53/14* (2019.01)
(Continued)

(52) U.S. Cl.
CPC ............ *B60L 11/1827* (2013.01); *B60L 53/14* (2019.02); *B60L 53/16* (2019.02); *B60L 53/18* (2019.02);
(Continued)

(58) Field of Classification Search
CPC .......... B60L 11/1827; B60L 53/14; H02J 7/02
See application file for complete search history.

(56) References Cited

U.S. PATENT DOCUMENTS 5,462,439 A * 10/1995 Keith ...................... B60L 53/16
320/109
7,719,229 B2 * 5/2010 Kaneko .................. B25J 19/005
320/113
(Continued)

FOREIGN PATENT DOCUMENTS

CN 101648377 A 2/2010
CN 102545275 A 7/2012
(Continued)

*Primary Examiner* — Richard V Muralidar
(74) *Attorney, Agent, or Firm* — Saliwanchik, Lloyd & Eisenschenk

(57) ABSTRACT

A charging device of an automatic cruise platform for a greenhouse comprises a power monitoring module, an information transmission module and a sensor module, which are located on a movement monitoring platform (25), and a ground pressure sensor module, a charging module, an information receiving module (20), an information collection module (21), a control module (22), an AC-DC conversion module (23), and a power control module (24), which are located on a smart charging device (33). The device can automatically return to be charged at a cruise detection interval of a movement platform when the electric quantity is lower than a threshold, thereby improving the working efficiency and automation degree of a movement monitoring platform, reducing the labor management cost, and meanwhile greatly improving the reliability and safety (Continued)

of a charging docking process and facility power consumption.

7 Claims, 4 Drawing Sheets

(51) Int. Cl.
 *B60L 53/36*  (2019.01)
 *B60L 53/35*  (2019.01)
 *H02J 7/02*  (2016.01)
 *B60L 53/16*  (2019.01)
 *B60L 53/18*  (2019.01)
 *G01R 31/36*  (2020.01)
 *G01S 15/08*  (2006.01)
 *G01S 17/08*  (2006.01)
 *H02J 7/00*  (2006.01)
 *G01S 17/931*  (2020.01)
 *G01S 15/931*  (2020.01)

(52) U.S. Cl.
 CPC ............... *B60L 53/35* (2019.02); *B60L 53/36* (2019.02); *G01R 31/3648* (2013.01); *G01S 15/08* (2013.01); *G01S 17/08* (2013.01); *H02J 7/0042* (2013.01); *H02J 7/02* (2013.01); *B60L 2200/40* (2013.01); *B60L 2210/30* (2013.01); *G01S 15/931* (2013.01); *G01S 17/931* (2020.01)

(56) References Cited

U.S. PATENT DOCUMENTS

| | | | | |
|---|---|---|---|---|
| 8,473,131 | B2 * | 6/2013 | Leary | B60L 53/34 |
| | | | | 701/22 |
| 8,925,885 | B2 * | 1/2015 | Ishii | B60L 53/18 |
| | | | | 248/280.11 |
| 9,421,879 | B2 * | 8/2016 | Pastoor | B60L 53/35 |
| 9,493,087 | B2 * | 11/2016 | Leary | B60L 11/1824 |
| 2006/0273756 | A1 * | 12/2006 | Bowling | B60L 53/305 |
| | | | | 320/107 |

FOREIGN PATENT DOCUMENTS

| | | | |
|---|---|---|---|
| CN | 103683345 | A | 3/2014 |
| CN | 203747461 | U | 7/2014 |
| CN | 105048540 | * | 11/2015 |
| CN | 105048540 | A | 11/2015 |
| CN | 105098885 | A | 11/2015 |

* cited by examiner

CHARGING DEVICE OF AUTOMATIC CRUISE PLATFORM FOR GREENHOUSE

CROSS REFERENCE TO RELATED APPLICATIONS

This application is a National Stage Application of International Application Number PCT/CN2015/097792, filed Dec. 18, 2015; which claims priority to Chinese Application No. 201510398874.1, filed Jul. 8, 2015.

FIELD OF THE INVENTION

The present invention belongs to the field of agricultural machinery of facilities, and relates to the technology of automatic charging for a movement monitoring platform of a greenhouse.

BACKGROUND OF THE INVENTION

At present, as the greenhouses develop toward industrialization and intelligence, more and more detection devices are mounted on the movement monitoring platform in order to realize the regular automatic cruise and monitoring of crop growth and environmental information, thereby achieving accurate and efficient information acquisition. Based on the movement monitoring platform, the greenhouse information collection and monitoring system is usually powered by lithium batteries and other rechargeable batteries. In order to ensure the normal cruise and monitoring of the system, there is a need for regular charging operation. However, the traditional artificial timed charging wastes time and energy, not only increases the labor intensity, but also is prone to insufficient charging or over charging, and thereby not only affecting the service life of the batteries, reducing the reliability of the equipment operation, and meanwhile, increasing labor costs and causing reduction in the economic benefits of the greenhouse. Therefore, it is a key issue to be solved for the automatic cruise platform for the greenhouse of how to provide a timely and reliable charging for the movement monitoring platform during the power shortage or the interval between two cruise tasks to ensure the continuous, reliable and smooth implementation of the automatic cruise task and provide timely feedback information for the environmental regulation of the greenhouse.

In the field of the existing wired contact charging, the positioning of the movement platform on the charging socket is generally detected visually or via a laser distance measuring sensor. The invention patent application with application No. 201010576969.5 discloses an intelligent charging device for a robot and an automatic charging method thereof. The intelligent charging device comprises a power connection module, a movement module, a battery monitoring module, an external image acquisition module, a storage module and a main control module. Wherein after receiving the charging request signal, the main control module will control the external image acquisition module to collect the images of the surrounding environment of the robot, search the image matching with the reference image of the external power socket in the collected image, and determines whether or not the external power socket exists; if the external power socket exists, the position of the power connection module relative to the external power socket will be calculated, and the movement module is controlled to drive the robot to move towards the external power socket, thereby aligning the power connection module and the external power socket and connecting the power connection module with the external power socket. According to the device and the method, the external power socket can be searched to complete electric energy supplement in case of insufficient electric quantity of batteries, however, for the device and the method, the power socket is positioned via visual search, the distance through which the robot goes while searching for the power socket via visual search is unknown, resulting in reduction of the working efficiency of the robot. As the charging device is installed on the robot, not only the weight of the robot is increased, but also the unnecessary loads of electric energy are added, which further aggravates the power shortage of the system. When the system searches for the charging socket, the relative position between the power connection module of the robot and the socket requires a higher movement accuracy of the robot, and as 220V AC is generally applied in the external power socket, and the power socket has been in the power-up state, when the power connection module docks with the socket for adjustment, there will be some frictions and collisions, resulting in some potential safety hazards.

The invention patent application with application No. 200810131384.5 discloses an "automatic charging self-discipline movement robot device and an automatic charging method thereof". The device will receive an infrared signal when the remaining battery capacity is insufficient or when the charging command is inputted; a microcomputer detects the position of the charging socket in accordance with the signal received by the infrared signal receiving device and controls the robot to move; and electric energy is obtained by making contact with the connecting terminal. The design of the charging socket separated from the robot effectively reduces the loads of the movement robot, thereby improving the cruising ability of the robot. However, the charging socket device requires the movement robot to move to the charging socket without error and has a high requirement on the movement accuracy of the robot approaching the charging socket, and the device and method for searching the charging socket are complex, resulting in a substantial increase in the cost of the device.

In summary, as for the existing automatic charging device for the intelligent movement platform, owing to the limitation of its device and method, it is difficult to meet the demand that when carrying out timed automatic cruise for a long time without human intervention, the movement platform for monitoring the crop growth of the greenhouse and the environmental needs to return to the charging area automatically and quickly for timely charging at cruise intervals. As the existing device requires a high precision to the movement position of the movement platform and the movement platform must stop at a fixed charging point to complete charging, when there is a positional deviation of the movement platform from the charging device, the adjustment of the movement platform control device, and making the relative displacement between the charging port on the movement platform and the plug of the charging device close to zero, will meet large technical difficulties, result in significant increase in the cost of the platform and fail to meet the requirements of facility environmental on safety protection and electrical safety.

CONTENTS OF THE INVENTION

The present invention aims to provide a charging device of an automatic cruise platform for a greenhouse, which achieves automatic docking with a charging port of a movement monitoring platform for a greenhouse to complete the charging task and improve working efficiency of the movement platform.

In order to solve the above technical problem, the specific technical solution adopted by the present invention is as follows:

A charging device of an automatic cruise platform for a greenhouse, comprising a power monitoring module, an information transmission module, a sensor module, a ground pressure sensor module, a charging module, an information receiving module, an information collection module, a control module, an AC-DC conversion module and a power control module;

The power monitoring module, the information transmission module and the sensor module are installed on the movement monitoring platform; the ground pressure sensor module is fixed in the pit, a flat plate is arranged on the ground pressure sensor module and is on the same horizontal plane as the ground level; the charging module is fixed on the ground; the information receiving module, the information collection module, the control module, the AC-DC conversion module and the power control module are respectively installed above the charging module.

The power monitoring module on the movement monitoring platform (25) comprises a 12V lithium battery (29) and an industrial personal computer (30) for monitoring the electric quantity of the lithium battery.

The information transmission module is a wireless transmission module (32), and the wireless transmission module (32) is connected with the industrial personal computer (30) through a data line for information transmission.

The sensor module comprises an ultrasonic sensor A(28) positioned on the left side of the movement monitoring platform (25) and an ultrasonic sensor B(31) on the rear and a laser distance measuring sensor (26) positioned in the center of the charging port (27) of the lithium battery; the ultrasonic sensor A(28) on the left side and the ultrasonic sensor B(31) on the rear are respectively used to measure the distance of the left side of and rear of the movement monitoring platform (25) from the wall; and the laser distance measuring sensor (26) is used to measure the height of the center of the charging port (27) of the lithium battery from the ground.

The ground pressure sensor module comprises a pressure sensor B(18) and a flat plate (19), wherein the pressure sensor B(18) is connected with the flat plate (19) by a connecting device; and the flat plate (19) is placed on the pressure sensor B(18). The intelligent charging device of the movement monitoring platform for a facility, wherein: the charging module comprises a housing (1), a horizontal movement mechanism, a vertical movement mechanism and a transverse telescopic mechanism; the housing (1) is installed on the ground; and the movement mechanism is installed inside the housing (1), and an electrical module is mounted thereon;

The horizontal movement mechanism comprises a sliding block A(2), a lead screw A(3), a slick rod A(4) and a motor A(5); one side inside the sliding block A(2) is provided with an internal threaded hole, and the other side is provided with an unthreaded hole; and the lead screw A(3) is in threaded connection with the internal threaded hole;

The slick rod A(4) is sleeved in the unthreaded hole, and the lead screw A(3), the slick rod A(4) and the motor A(5) are installed on a gantry sliding block B(6); and the motor A(5) drives the lead screw to make rotary motion, which is converted into the horizontal movement of the sliding block A(2);

The vertical movement mechanism comprises a gantry sliding block B(6), a lead screw B(7), a slick rod B(8) and a motor B(9); one side of the gantry sliding block B(6) is provided with an internal threaded hole, and the other side is provided with an unthreaded hole; the lead screw B(7) is in threaded connection with the internal threaded hole via threads; the slick rod B(8) is sleeved in the unthreaded hole; the lead screw B(7), the slick rod B(8) and the motor B(9) are installed on the housing (1); and the lead screw B(7) drives the gantry sliding block B(6) to move in the vertical direction under the driving of the motor B(9);

The transverse telescopic mechanism comprises a base (10), a motor C(11), a lead screw C(12), a slick rod C(13), a sliding block C(14), a limited block (15), a charging plug (16) and a pressure sensor A(17). The base (10) is connected with the sliding block A(2) moving horizontally by a bolt; the motor C(11) is installed inside the base (10); one end of the lead screw C(12) is installed on the base (10) and is connected with the motor C (11), and the other end is installed on the limited block (15); one end of each of two slick rods C(13) is installed on the base (10), and the other end is installed on the limited block (15); a hollow circular tube is arranged inside the sliding block C(14) and is installed on the lead screw C(12) and the slick rods C(13), transversely moving between the base (10) and the limited block (15); the charging plug (16) is installed on the top of the sliding block C(14); and the pressure sensor A(17) is installed on the top of the charging plug (16).

The information receiving module (20) is a wireless receiving device for receiving information transmitted by the movement monitoring platform (25) and controlling the expansion and retraction of the intelligent charging device (33); and the wireless receiving device is connected with the control module (22), transmitting the received information to the control module (22);

The information collection module (21) is a signal collection card for collecting signals from the sensor; the control module (22) comprises a movement control card and a driving module; the movement control card is used for controlling the horizontal, vertical and transverse movement of the motor; the driving module is used for driving the running of the motor to complete the docking of the charging plug (16) and the charging port (27) of the lithium battery.

The AC-DC conversion module (23) is a power converter for converting 220V AC into 12V DC for charging the lithium battery.

The working process of the present invention is that:

The movement monitoring platform 25 is started to carry out cruise according to the set movement track 35 for the detection of the crop growth and environmental information of facilities; the power monitoring module on the movement monitoring platform 25 monitors the electric quantity of the 12V lithium battery 29 in real time to determine whether or not the electric quantity is lower than the preset value; when the electric quantity is lower than 20% of the set value, the industrial personal computer 30 will terminate the cruise task, retreat the soil-bin from the current position, and quickly return to the charging area 34 according to the shortest planned route; when the movement monitoring platform 25 returns to the charging area 34, the pressure sensor B18 in the ground pressure sensor module will trigger a signal to charge the intelligent charging device 33, and equipment on the intelligent charging device will start to run; at this time, the left ultrasonic sensor 28, the rear ultrasonic sensor 31 and the laser distance measuring sensor 26 on the movement monitoring platform 25 respectively transmit the parameters of the distance of the current charging area 34 from the wall in the X-axis direction, the distance from the wall in the Y-axis direction and the distance from the ground in the Z-axis direction to the industrial personal computer 30; the industrial personal computer 30 converts the received positional parameters into positional coordinates of the center of the charging port 27, and transmits the positional coordinates through the wireless transmission module 32 in the wireless way to the intelligent charging device 33; the wireless receiving module 20 of the intelligent charging device transmits the received positional coordinates to the control module 22, and the control module 22 calculates the displacement offset of the charging plug 16 to be moved according to the initial position of the charging plug 16 and the positional coordinates of the charging port 27; when the charging plug 16 docks with the charging port 27, the pressure sensor A17 on the charging plug 16 will control the charging plug 16 to stop moving when contacting the inside of the charging port 27, and at the same time, the charging plug 16 will be energized to charge the movement monitoring platform 25; in the charging process, if the cruise task of the next period of the movement monitoring platform starts, the power monitoring module will detect whether or not the electric quantity of the lithium battery 29 meets the requirement of re-cruise; when the electric quantity is lower than 60% of the preset value, the cruise task will be canceled and charging will be continued; and when the electricity quantity exceeds 60% of the preset value (there is a cruise task at this time) or charging is full, the industrial personal computer 30 positioned on the movement monitoring platform 25 will transmit signals to the intelligent charging device 33, making the charging plug 16 of the charging device retracted, and the movement monitoring platform 25 will start the automatic cruise task of the next period or wait for cruise; after the movement monitoring platform 25 completes the cruise task, the movement monitoring platform 25 will retreat the soil-bin from the current position where cruise ends, and quickly return to the charging area 34 as per the planned shortest path to charge the movement monitoring platform 25.

The present invention has the following beneficial effects:
(1) According to the invention, with the programmable control, the intelligent movement monitoring platform can quickly return to the charging area as per the shortest path to complete the charging of the movement monitoring platform in case of shortage of electric quantity or the ending of the cruise task and at the intermittent period of the cruise cycle, thereby relieving the labor intensity of personnel, reducing labor costs and improving the automation degree of the platform, and meanwhile, effectively improving the working efficiency of the movement monitoring platform and ensuring the continuous cruise operation of the monitoring platform for the facility.
(2) According to the invention, the intelligent charging device and the movement platform are in a separated design, so that the loads of the movement monitoring platform for the facility can be effectively reduced, and the structural design of the movement platform can be optimized, thereby prolonging the cruising ability of the movement platform.
(3) According to the invention, when the movement platform returns to the charging area, the movement platform is kept stationary. By controlling the charging device, relative displacement between the position of its port plug and the position of the charging port of the movement platform is zero, so that the intelligent charging device can automatically move by the corresponding displacement to dock with the charging port of the movement monitoring platform in accordance with the positional coordinates where the movement monitoring platform stops at the charging area, the movement platforms stopping within the range of the charging area can dock with the charging device for charging, thereby achieving high adaptivity; and displacement between the port plug of the charging device and the charging port of the movement platform is easy to control. Compared with the prior art, the docking accuracy of the port can be ensured, and the device costs are reduced substantially.
(4) According to the invention, after the ground pressure sensor module is triggered, the intelligent charging device will be powered on only in the case of being charged. Compared with the prior art, the electricity utilization process is safer.

BRIEF DESCRIPTION OF THE DRAWINGS

To illustrate the examples and technical solutions of the present invention more clearly, the following briefly introduces the accompanying drawings required for describing the examples of the invention and the technical solutions thereof.

Figure 1:
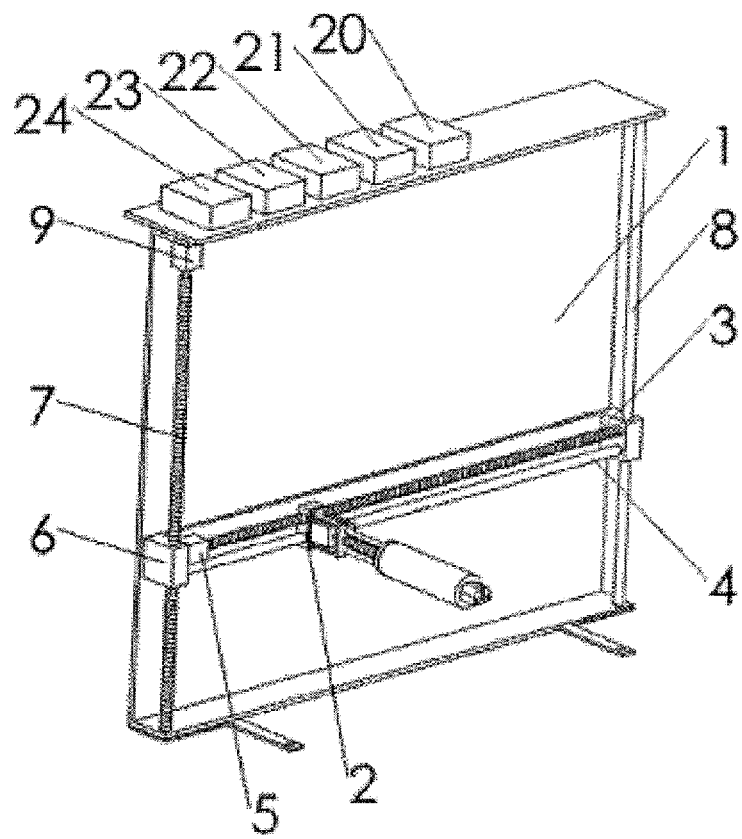
FIG. 1 is a schematic structural view of the apparatus of the present invention.

In the drawings: 1. Housing 2. Sliding block A 3. Lead screw A 4. Slick rod A 5. Motor A 6. Gantry sliding block B 7. Lead screw B 8. Slick rod B 9. Motor B 10. Base 11. Motor C 12. Lead screw C 13. Slick rod C 14 Sliding block C 15. Limited block 16. Charging plug 17. Pressure sensor A 18. Pressure sensor B 19. Flat plate 20. Information receiving module 21. Information collection module 22. Control module 23. AC-DC conversion module 24. Power control module 25. Movement monitoring platform 26. Laser distance measuring sensor 27. Charging port 28. Ultrasonic sensor A 29. 12V lithium battery 30. Industrial personal computer 31. Ultrasonic sensor B 32. Wireless transmission module 33. Intelligent charging device 34. Charging area 35. Movement track.

DETAILED DESCRIPTION OF THE EMBODIMENTS

The technical solutions of the present invention will be further described in detail below with reference to the accompanying drawings and specific embodiments.

Figure 4:
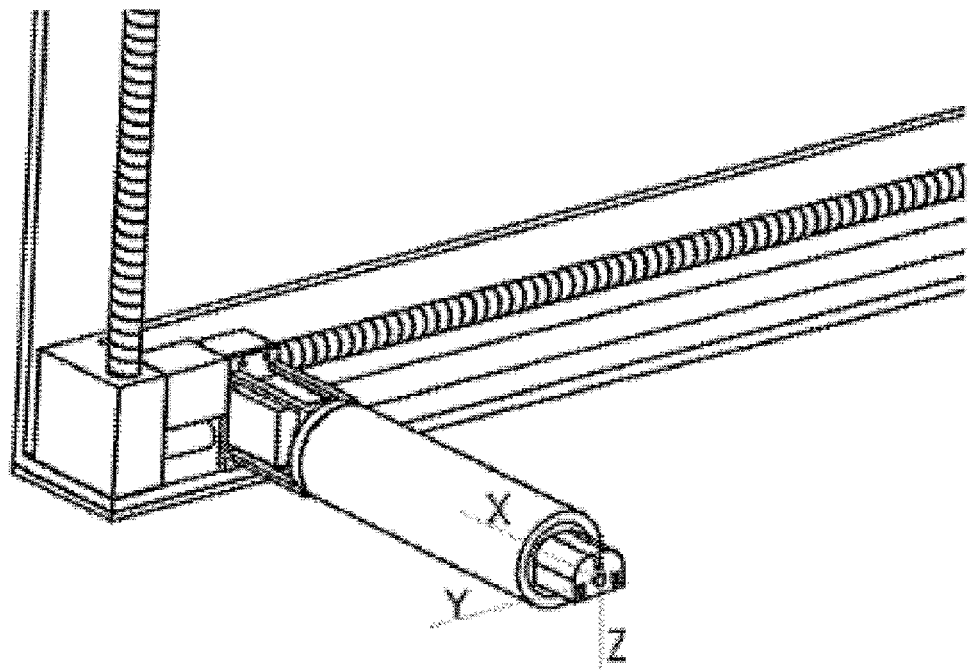
FIG. 4 is a three-dimensional coordinate graph of the apparatus of the present invention.
Figure 5:
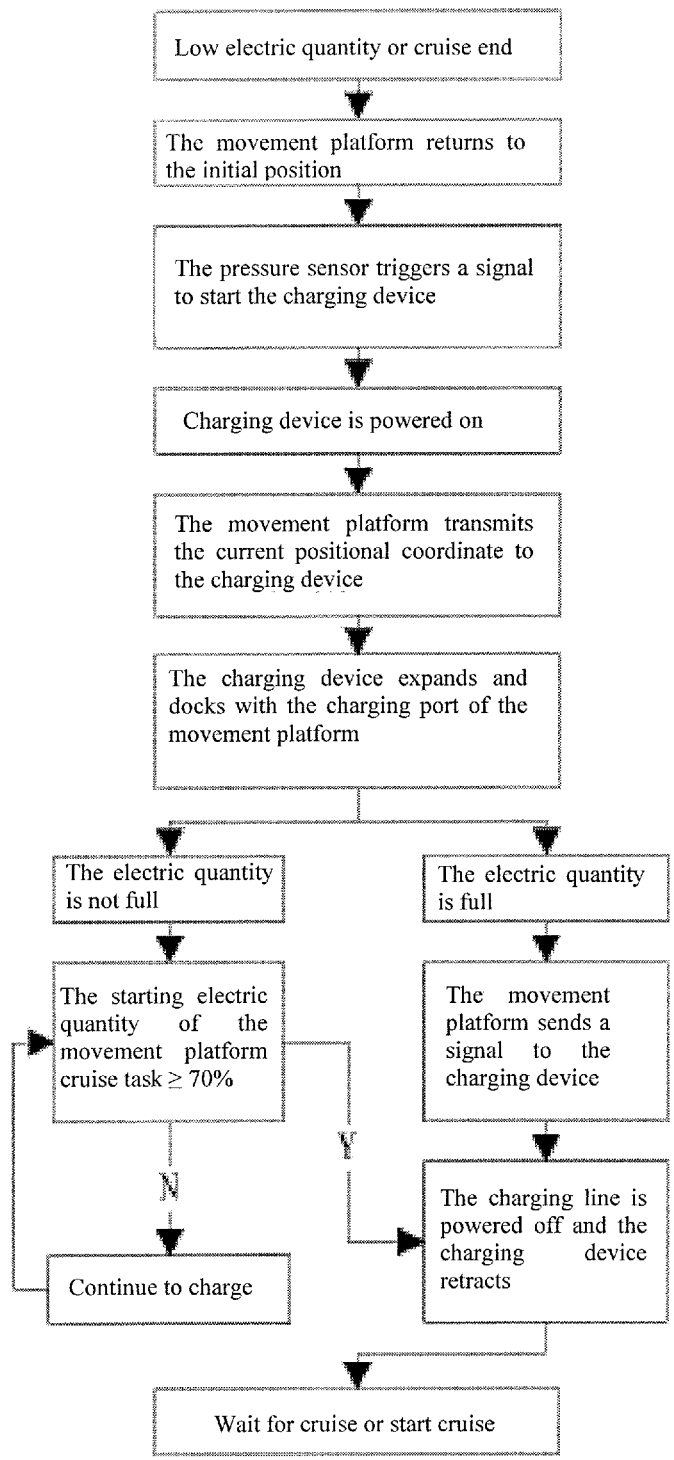
FIG. 5 is a working flowchart of the apparatus of the present invention.

As shown in FIG. 5, an intelligent charging method for an automatic cruise platform for a greenhouse comprises the following steps that:

step 1, the movement monitoring platform 25 performs the cruise task, and when the power monitoring module detects that the electric quantity of the 12V lithium battery 29 is less than 20%, the industrial personal computer 30 will terminate the current cruise task and control the movement monitoring platform 25 to automatically return to the charging area 34;

step 2, after the movement monitoring platform 25 completes the cruise task, and when the electric quantity of the lithium battery is less than 30% prior to the execution of the next cruise task, the movement monitoring platform 25 will return to the charging area 34 to complete the supplement of electric energy; after controlling the charging area 34, the movement monitoring platform 25 for the facility will stop at the ground pressure sensor module, and the pressure sensor B18 triggers a signal to the power control module 24 to make the intelligent charging device be in the power-on state; (the pressure sensor has the similar function of the switch, and when the movement platform returns to the charging area, it means turning on the switch and powering on the charging device, but not yet charging the movement platform.)

step 3, after the movement monitoring platform stops at the charging area 34 (in order to simplify the structure of the charging device, the existing sensor device on the movement platform is used to detect the position of the charging port of the 12V lithium battery for the movement platform stopping at the charging area, that is, the charging process is completed jointly by the charging device and the movement platform, the charging device is responsible for charging, and the movement platform is responsible for guiding work, guiding the charging device to move to the charging port of the 12V lithium battery for the movement platform) as shown in FIG. 4, an coordinate axis is set at the initial position of the center of the port of the charging plug 16 of the intelligent charging device 33; and the ultrasonic sensor A28 on the left side of the movement monitoring platform, the ultrasonic sensor B31 on the rear and the laser distance measuring sensor 26 in the center of the charging port 27 of the lithium battery respectively measure distance X1 between the left side (X-axis direction) of the movement monitoring platform 25 and the wall, distance Y1 between the rear (Y-axis direction) of the movement monitoring platform 25 and the wall and distance Z1 between the center of the charging port of the lithium battery and the ground at this time;

step 4, distance between the ultrasonic sensor A28 on the left side (X-axis direction) of the movement monitoring platform 25 and the charging port 27 is set as $X_{vehicle}$, and distance between the ultrasonic sensor B31 on the rear (Y-axis direction) of the movement monitoring platform 25 and the center of the charging port 27 is set as $Y_{vehicle}$;

step 5, the industrial personal computer 30 converts the received data into positional coordinate of the center of the charging port 27, and the positional coordinate of the center of the charging port 27 is (X1+$X_{vehicle}$, Y1+$Y_{vehicle}$, Z1), and transmits the positional coordinate to the wireless receiving module 20 of the intelligent charging device 33 through the wireless transmission module 32 on the movement monitoring platform;

step 6, the initial positions of the center of the port of the charging plug 16 of the intelligent charging device 33 are as follows: distance $X_{charging}$ between the center of the plug port and the wall along the X axis, distance $Y_{charging}$ between the center of the plug port and the wall along the Y axis, distance $Z_{charging}$ between the center of the plug port and the ground along the Z axis, and the coordinate of the initial position of the center of the plug port is ($X_{charging}$, $Y_{charging}$, $Z_{charging}$);

step 7, the intelligent charging device 33 calculates the relative displacement that the charging device needs to move according to the received positional coordinate of the charging port 27 on the movement monitoring platform and the initial position of the port of the charging plug 16, drives the charging plug 16 to move by the corresponding displacement (X1+$X_{vehicle}$ −$X_{charging}$, Y1+$Y_{vehicle}$−$Y_{charging}$, Z1−$Z_{charging}$) along the X axis, the Y axis and the Z axis, and docks with the charging port 27 on the movement monitoring platform 25 to complete the charging task; and step 8, the battery is not fully charged during charging, (the previous is that the docking process via the calculation of position between the charging device and the charging port on the movement platform after the movement platform returns to the charging area in the case of shortage of electric quantity of the movement platform or the ending of the cruise task, and the latter is that two cases of separation of the plug at the port of the charging device from the charging port on the movement platform in the case that the movement platform has the cruise task or the electric quantity is full, the movement platform and the charging device work together, and the movement platform controls the charging device to be separated from the charging device in the case of cruise task or full electric quantity, and the charging device is still responsible for charging), the next cruise task of the movement monitoring platform has been started, when the electric quantity is less than 60%, the system will cancel the cruise task and continue to charge as it cannot complete a single cruise and return automatically, when the electric quantity is not full but is over 60%, the industrial personal computer 30 of the movement monitoring platform will transmit the signal to the intelligent charging device 33 via the wireless transmission module 32, so that the intelligent charging device 33 retracts the charging arm, and the movement monitoring platform 25 starts the cruise task; when the electric quantity is full, the movement monitoring platform 25 will transmit the signal to the intelligent charging device 33, so that the intelligent charging device 33 retracts, and the movement monitoring platform 25 waits for the start of the cruise task.

An intelligent charging device for a movement monitoring platform of a facility comprises a power monitoring module, an information transmission module, a sensor module, a ground pressure sensor module, a charging module, an information receiving module, an information collection module, a control module, an AC-DC conversion module and a power control module, wherein the power monitoring module, the information transmission module and the sensor module are installed on the movement monitoring platform; the ground pressure sensor module is fixed in the pit, a flat plate is arranged on the ground pressure sensor module and is on the same horizontal plane as the ground level; the charging module is fixed on the ground; the information receiving module, the information collection module, the control module, the AC-DC conversion module and the power control module are installed above the charging module.

Figure 6:
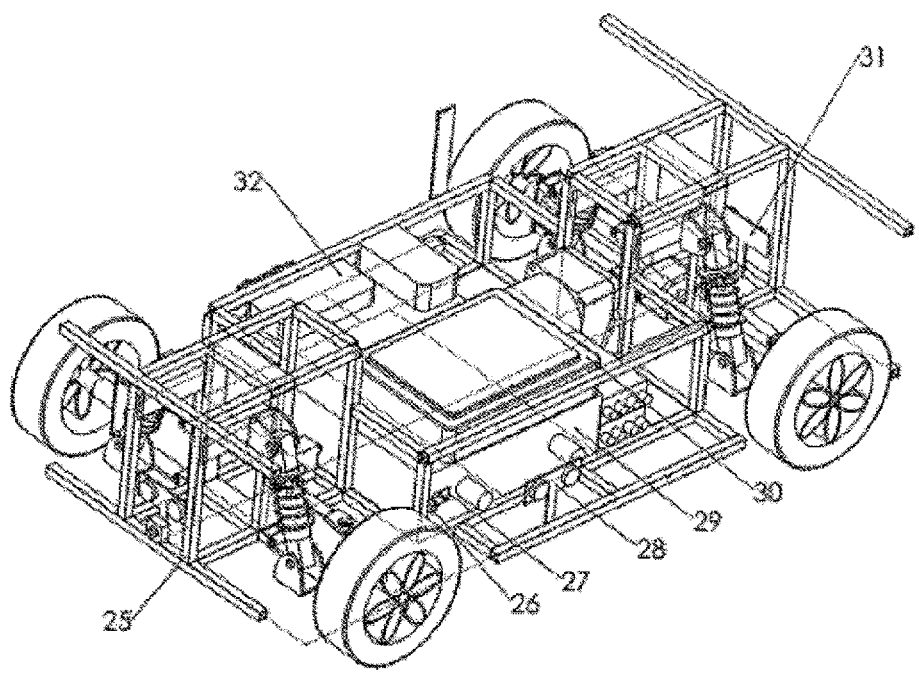
FIG. 6 is a schematic structural diagram of the movement monitoring platform of the present invention.

As shown in FIG. 6, the power monitoring module on the movement monitoring platform 25 comprises a 12V lithium battery 29 and an industrial personal computer 30 for monitoring the electric quantity of the lithium battery.

As shown in FIG. 6, the information transmission module of the movement monitoring platform is a wireless transmission module 32, and the wireless transmission module 32 is connected with the industrial personal computer 30 through a data line for information transmission.

As shown in FIG. 6, the sensor module comprises an ultrasonic sensor A28 positioned on the left side of the movement monitoring platform 25 and an ultrasonic sensor B31 on the rear and a laser distance measuring sensor 26 positioned in the center of the charging port 27 of the lithium battery; the ultrasonic sensor A28 on the left side and the ultrasonic sensor B31 on the rear are respectively used to measure the distance of the left side and rear of the movement monitoring platform 25 from the wall; and the laser distance measuring sensor 26 is used to measure the height of the center of the charging port 27 of the lithium battery from the ground.

Figure 3:
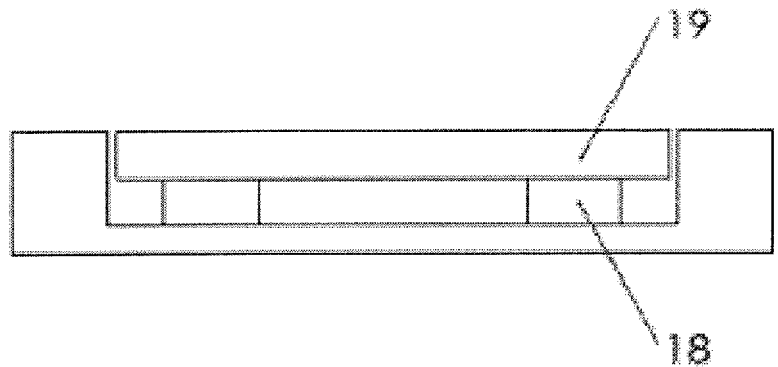
FIG. 3 is a schematic diagram of the ground pressure sensor of the apparatus of the present invention.

As shown in FIG. 3, the ground pressure sensor module comprises a pressure sensor B18 and a flat plate 19; the pressure sensor B18 is connected with the flat plate 19 via a connecting device; the flat plate 19 is placed on the pressure sensor B18, the pressure sensor B18 is arranged to set the pressure sensor B18 as zero; when returning to the charging area 34, the movement monitoring platform 25 will stop at the flat plate 19 and the pressure sensor 18 will trigger a signal to the power control module 24, powering on the intelligent charging device.

Figure 2:
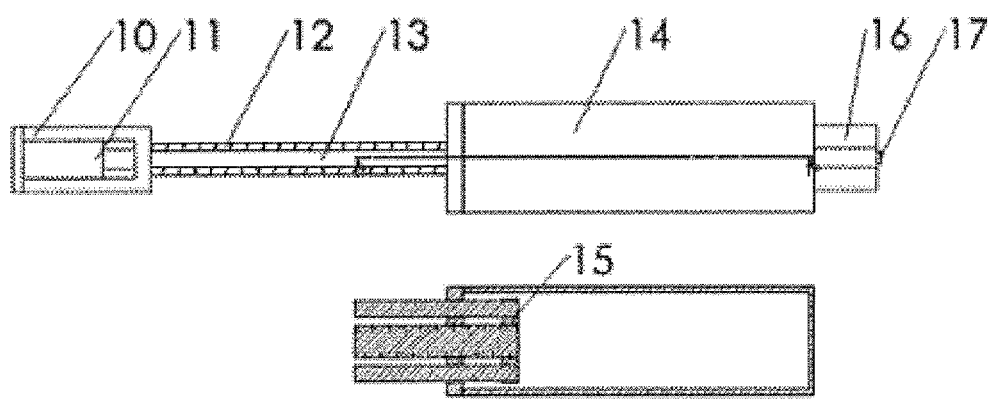
FIG. 2 is a schematic and cross-sectional view of the transverse telescopic mechanism of the apparatus of the present invention.

As shown in FIG. 1, the charging module comprises a housing 1, a horizontal movement mechanism, a vertical movement mechanism and a transverse telescopic mechanism, wherein the housing 1 is mounted on the ground; the movement mechanisms are installed inside the housing 1, and the electrical module is installed on the housing; the horizontal movement mechanism comprises a sliding block A2, a lead screw A3, a slick rod A4 and a motor A5; one side inside the sliding block A2 is provided with an internal threaded hole, and the other side is provided with an unthreaded hole; the lead screw A3 in threaded connection with the internal threaded hole via threads; the slick rod A4 is sleeved in the unthreaded hole; the lead screw A3, the slick rod A4 and the motor A5 are installed on gantry sliding block B6; the slick rod and the lead screw are arranged in parallel to fix the movement direction of the sliding block, avoiding the sliding block from making rotary motion with the lead screw; the motor A5 drives the lead screw to make rotary motion, which is converted into the horizontal movement of the sliding block A2; the vertical movement mechanism comprises a gantry sliding block B6, a lead screw B7, a slick rod B8 and a motor B9; one side of the gantry sliding block B6 is provided with an internal threaded hole, and the other side is provided with an unthreaded hole; the lead screw B7 is in threaded connection with the internal threaded hole via threads; the slick rod B8 is sleeved in the unthreaded hole; the lead screw B7, the slick rod B8 and the motor B9 are installed on the housing 1; and the lead screw B7 drives the gantry sliding block B6 to move in the vertical direction under the driving of the motor B9. As shown in FIG. 2, the transverse telescopic mechanism comprises a base 10, a motor C11, a lead screw C12, a slick rod C13, a sliding block C14, a limited block 15, a charging plug 16 and a pressure sensor A17. The base 10 is connected with the sliding block A2 moving horizontally by a bolt; the motor C 11 is installed inside the base 10; one end of the lead screw C12 is installed on the base 10 and is connected with the motor C11, and the other end is installed on the limited block 15; one end of the slick rods C13 is installed on the base 10, and the other end is installed on the limited block 15; a hollow circular tube is arranged inside the sliding block C14 and is installed on the lead screw C12 and the slick rods 13, transversely moving between the base 10 and the limited block 15; the charging plug 16 is installed on the top of the sliding block C14; and the pressure sensor A17 is installed on the top of the charging plug 16 and is used to detect pressure at the plug port; when detecting pressure, the pressure sensor A17 will trigger the signal, the control module 22 will control the motor C11 to stop running according to the received signal to avoid damage to the intelligent charging device 33 and the movement monitoring platform 25 when the charging plug 16 is excessively inserted into the charging port 27 of the lithium battery.

As shown in FIG. 1, the information receiving module 20 is a wireless receiving device for receiving information transmitted by the movement monitoring platform 25 and controlling the expansion and retraction of the intelligent charging device 33; and the wireless receiving device is connected with the control module 22, transmitting the received information to the control module 22.

As shown in FIG. 1, the information collection module 21 is a signal collection card, which is used for collecting the signal of the sensor.

As shown in FIG. 1, the control module 22 comprises a movement control card and a driving module; the movement control card is used for controlling the horizontal, vertical and transverse movement of the motor; the driving module is used for driving the running of the motor to complete the docking of the charging plug 16 and the charging port 27 of the lithium battery.

As shown in FIG. 1, the AC-DC conversion module 23 is a power converter for converting 220V AC into 12V DC for charging the lithium battery.

As shown in FIG. 1, the power control module 24 is used for controlling the power on and off of the power cord, so that the intelligent charging device 33 is in the power-on state when charging the movement monitoring platform 24 and is in the power-off state usually.

Figure 7:
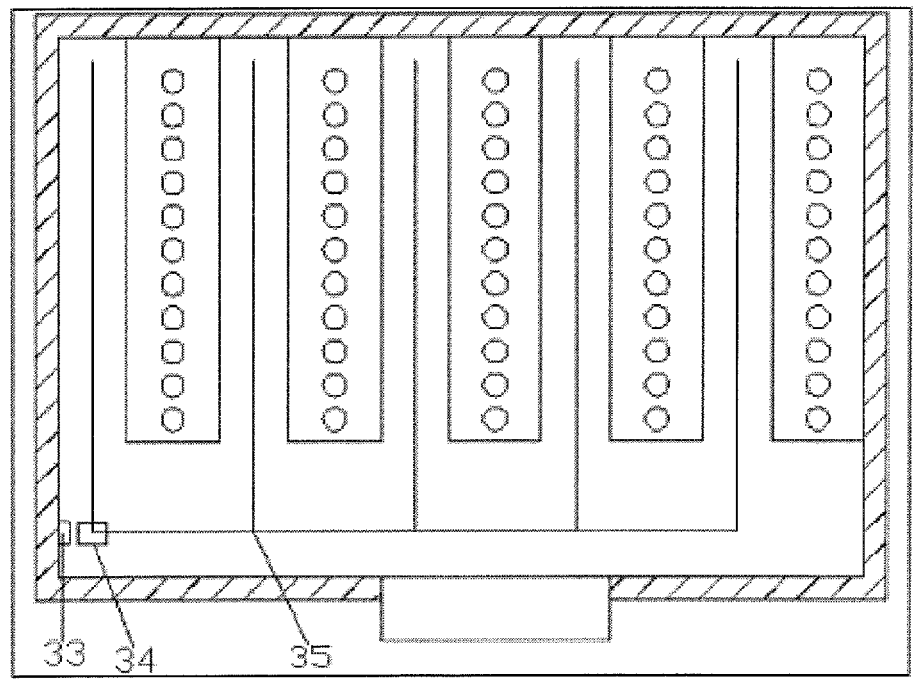
FIG. 7 is a movement track diagram of the movement monitoring platform of the present invention.

According to a charging device of an automatic cruise platform for a greenhouse, the working process is as follows:

as shown in FIG. 7, the movement monitoring platform 25 is started to carry out cruise according to the set movement track 35 for the detection of the crop growth and environmental information of facilities; the power monitoring module on the movement monitoring platform 25 monitors the electric quantity of the 12V lithium battery 29 in real time to determine whether or not the electric quantity is lower than the preset value; when the electric quantity is lower than 20% of the set value, the industrial personal computer 30 will terminate the cruise task, retreat the soil-bin from the current position, and quickly return to the charging area 34 according to the shortest planned route; when the movement monitoring platform 25 returns to the charging area 34, the pressure sensor B18 in the ground pressure sensor module will trigger a signal to charge the intelligent charging device 33, and equipment on the intelligent charging device will start to run; at this time, the left ultrasonic sensor 28, the rear ultrasonic sensor 31 and the laser distance measuring sensor 26 on the movement monitoring platform 25 respectively transmit the parameters of the distance of the current charging area 34 from the wall in the X-axis direction, the distance from the wall in the Y-axis direction and the distance from the ground in the Z-axis direction to the industrial personal computer 30; the industrial personal computer 30 converts the received positional parameters into positional coordinate of the center of the charging port 27, and transmits the positional coordinate through the wireless transmission module 32 in the wireless way to the intelligent charging device 33; the wireless receiving module 20 of the intelligent charging device transmits the received positional coordinates to the control module 22, and the control module 22 calculates the displacement offset of the charging plug 16 to be moved according to the initial position of the charging plug 16 and the positional coordinate of the charging port 27; when the charging plug 16 docks with the charging port 27, the pressure sensor A17 on the charging plug 16 will control the charging plug 16 to stop moving when contacting the inside of the charging port 27, and at the same time, the charging plug 16 will be energized to charge the movement monitoring platform 25; in the charging process, if the cruise task of the next period of the movement monitoring platform starts, the power monitoring module will detect whether or not the electric quantity of the lithium battery 29 meets the requirement of re-cruise; when the electric quantity is lower than 60% of the preset value, the cruise task will be canceled and charging will be continued; and when the electricity quantity exceeds 60% of the preset value (there is a cruise task at this time) or charging is full, the industrial personal computer 30 positioned on the movement monitoring platform 25 will transmit signals to the intelligent charging device 33, making the charging plug 16 of the charging device retracted, and the movement monitoring platform 25 will start the automatic cruise task of the next period or wait for cruise; after the movement monitoring platform 25 completes the cruise task, the movement monitoring platform 25 will retreat the soil-bin from the current position where cruise ends, and quickly return to the charging area 34 as per the planned shortest path to charge the movement monitoring platform 25.

The above is merely an exemplary description and helps to further understand the present invention. However, the specific details of the embodiments merely aims to illustrate the present invention and do not represent all the technical embodiments in the concept of the invention. Hence, the invention shall not be construed as being limited to the overall technical embodiments. Judging from some technicians, non-substantial modifications that do not depart from the concept of the invention, for example, simple changes or substitutions in technical features with the same or similar technical effects are considered to be within the protection scope of the present invention.

The invention claimed is:

1. A charging system for a moveable robotic platform that monitors greenhouse crops, the charging system comprising:
   a power monitoring module;
   an information transmission module;
   a sensor module;
   a ground pressure sensor module; and
   a charging device fixed on the ground and comprising a ground pressure sensor module,
   wherein the power monitoring module, the information transmission module, and the sensor module are installed on the moveable robotic platform,
   wherein the ground pressure sensor module comprises a first pressure sensor and a flat plate, wherein the first pressure sensor is fixed in a pit in the ground, and the flat plate is arranged on the first pressure sensor and lies in a same horizontal plane as the ground,
   wherein the charging device further comprises:
     a housing installed on the ground;
     a horizontal movement mechanism in the housing;
     a vertical movement mechanism in the housing;
     a transverse telescopic mechanism;
     an information receiving module on the housing;
     an information collection module on the housing;
     a control module on the housing;
     an AC-DC conversion module on the housing;
     a power control module on the housing; and
     an electrical module on the housing,
   wherein the horizontal movement mechanism comprises a first sliding block, a first lead screw, a first slick rod, and a first motor, wherein one side inside the first sliding block comprises a first internal threaded hole, and the other side comprises a first unthreaded hole, and wherein the first lead screw is in threaded connection with the first internal threaded hole,
   wherein the first slick rod is sleeved in the first unthreaded hole, and the first lead screw, the first slick rod and the first motor are installed on a gantry sliding block, wherein the first motor drives the first lead screw to make rotary motion, which is converted into horizontal movement of the first sliding block,
   wherein the vertical movement mechanism comprises the gantry sliding block, a second lead screw, a second slick rod, and a second motor, wherein one side of the gantry sliding block comprises a second internal threaded hole, and the other side comprises a second unthreaded hole, wherein the second lead screw is in threaded connection with the second internal threaded hole via threads, wherein the second slick rod is sleeved in the second unthreaded hole, wherein the second lead screw, the second slick rod, and the second motor are installed on the housings, wherein the second lead screw drives the gantry sliding block to move in a vertical direction under the driving of the second motor,
   wherein the transverse telescopic mechanism comprises a base, a third motor, a third lead screw, a third slick rod, a third sliding block, a limited block, a charging plug, and a second pressure sensor;
   wherein the base is connected with the first sliding block moving horizontally by a bolt, wherein the third motor is installed inside the base, wherein one end of the third lead screw is installed on the base and is connected with the third motor, and the other end is installed on the limited block, wherein one end of the third slick rod is installed on the base, and the other end of the third slick rod is installed on the limited block, wherein a hollow circular tube is arranged inside the third sliding block and is installed on the third lead screw and the third slick rod, transversely moving between the base and the limited block, and
   wherein the charging plug is installed on a top surface of the third sliding block, and the second pressure sensor is installed on a top surface of the charging plug.

2. The charging system according to claim 1, wherein the power monitoring module comprises a 12V lithium battery and an industrial personal computer for monitoring a charge of the 12V lithium battery.

3. The charging system according to claim 2, wherein the information transmission module is a wireless transmission module that is connected with the industrial personal computer through a data line for information transmission.

4. The charging system according to claim 2, wherein the sensor module comprises:
   a first ultrasonic sensor disposed on a left side of the moveable robotic platform;
   a second ultrasonic sensor on a rear of the moveable robotic platform; and
   a laser distance measuring sensor disposed in a center of a charging port of the 12V lithium battery,
   wherein the first ultrasonic sensor is configured to measure a distance between the left side of the moveable robotic platform and a wall,
   wherein the second ultrasonic sensor is configured to measure a distance between the rear of the moveable robotic platform and the wall, and
   wherein the laser distance measuring sensor is used to measure a height of the center of the charging port of the 12V lithium battery from the ground.

5. The charging system according to claim 1, wherein the first pressure sensor is connected with the flat plate by a connecting device.

6. The charging system according to claim 1, wherein the information receiving module is a wireless receiving device for receiving information transmitted by the moveable robotic platform and controlling an expansion and retraction of the charging device,
- wherein the wireless receiving device is connected with the control module, transmitting the received information to the control module,
- wherein the information collection module is a signal collection card for collecting signals from the sensor module,
- wherein the control module comprises a movement control card and a driving module,
- wherein the movement control card is configured to control horizontal movement of the first motor, vertical movement of the second motor, and transverse movement of the third motor,
- wherein the driving module is configured to drive the first motor, the second motor, and the third motor to complete a docking of the charging plug and a charging port of a 12V lithium battery of the power monitoring module.

7. The charging system according to claim 1, wherein the AC-DC conversion module is a power converter for converting 220V AC into 12V DC for charging a 12V lithium battery of the power monitoring module.

* * * * *